(12) United States Patent
Espiritu et al.

(10) Patent No.: US 8,395,254 B2
(45) Date of Patent: Mar. 12, 2013

(54) INTEGRATED CIRCUIT PACKAGE SYSTEM WITH HEATSPREADER

(75) Inventors: Emmanuel Espiritu, Singapore (SG); Dario S. Filoteo, Jr., Singapore (SG); Leo A. Merilo, Singapore (SG); Philip Lyndon Cablao, Singapore (SG); Rachel Layda Abinan, Singapore (SG); Allan Ilagan, Singapore (SG)

(73) Assignee: STATS Chippac Ltd., Singapore (SG)

( * ) Notice: Subject to any disclaimer, the term of this patent is extended or adjusted under 35 U.S.C. 154(b) by 469 days.

(21) Appl. No.: 11/278,008

(22) Filed: Mar. 30, 2006

(65) Prior Publication Data
US 2007/0235859 A1   Oct. 11, 2007

(51) Int. Cl.
*H01L 23/10* (2006.01)
(52) U.S. Cl. ............... 257/706; 257/713; 257/E23.101
(58) Field of Classification Search .......... 257/706, 257/713, 719, 707, 675
See application file for complete search history.

(56) References Cited

U.S. PATENT DOCUMENTS

| | | | | |
|---|---|---|---|---|
| 5,289,039 A | * | 2/1994 | Ishida et al. | 257/796 |
| 5,859,471 A | * | 1/1999 | Kuraishi et al. | 257/666 |
| 5,872,395 A | * | 2/1999 | Fujimoto | 257/675 |
| 5,877,552 A | | 3/1999 | Chiang | |
| 6,432,742 B1 | * | 8/2002 | Guan et al. | 438/106 |
| 6,538,321 B2 | * | 3/2003 | Huang et al. | 257/706 |
| 6,580,167 B1 | * | 6/2003 | Glenn et al. | 257/718 |
| 6,848,172 B2 | | 2/2005 | Fitzgerald et al. | |
| 6,906,413 B2 | | 6/2005 | Bish et al. | |
| 2002/0046850 A1 | * | 4/2002 | Onoue | 174/35 R |
| 2004/0036172 A1 | | 2/2004 | Azuma et al. | |
| 2005/0093135 A1 | * | 5/2005 | Liu et al. | 257/707 |
| 2005/0104195 A1 | * | 5/2005 | Yang | 257/706 |

* cited by examiner

*Primary Examiner* — Wael Fahmy
*Assistant Examiner* — Sarah Salerno
(74) *Attorney, Agent, or Firm* — Ishimaru & Associates LLP; Mikio Ishimaru

(57) ABSTRACT

An integrated circuit package system includes providing a substrate having an integrated circuit, attaching a heatspreader having a force control protrusion on the substrate, and forming an encapsulant over the heatspreader and the integrated circuit.

20 Claims, 3 Drawing Sheets

INTEGRATED CIRCUIT PACKAGE SYSTEM WITH HEATSPREADER

TECHNICAL FIELD

The present invention relates generally to package systems, and more particularly to a system for an integrated circuit package.

BACKGROUND ART

The advent of integrated circuitry has given rise to the need for integrated circuit (IC) packages that will both house and protect the integrated circuit die. These integrated circuit packages provide a mechanism for making electrical interconnection between the circuits on the integrated circuit die and the leads that are utilized to make electrical interconnections to circuits, power, and ground external to the integrated circuit die. For early types of integrated circuits, the packaging of the integrated circuits was relatively straightforward and generally involved an array of leads arranged around a die cavity to be electrically connected to associated die pads. There were also relatively few circuits on each integrated circuit die, and the circuit operational rates were by modern day standards relatively slow. Accordingly, size and power was relatively less important than the consideration of economical assembly.

Across virtually all applications, there continues to be growing demand for reducing size and increasing performance of integrated circuits. The seemingly endless restrictions and requirements are no more visible than with products in our daily lives. Smaller and denser integrated circuits are required in many portable electronic products, such as cell phones, portable computers, voice recorders, etc. as well as in many larger electronic systems, such as cars, planes, industrial control systems, etc. As the demand grows for smaller electronic products with more features, manufacturers are seeking ways to include more features as well as reduce the size of the integrated circuit packages. To meet these needs, packaging technologies are increasingly using smaller form factors with more circuits.

As the integrated circuit technology advances, more circuit cells can be fabricated in a similar die area so that substantially increased functionality can be accomplished on a given integrated circuit die. The added functionality and increase in the number of circuits generally involves a larger amount of power. As physical sizes decrease and the numbers of circuits increase, it has become necessary to develop integrated circuit packages that would accommodate the increased power. Both integrated circuit users and integrated package manufacturers worked to develop integrated circuit package systems that would accommodate the higher power requirements.

Most of the thermally enhanced molded ball grid array (BGA) packages (bump or non-bump die) focus on attaching a heatspreader to the top of an integrated circuit die and/or a substrate. One such attempt to attach the heatspreader includes the heatspreader touching the integrated circuit die surface but no protection for the die from crashing in the top mold cavity during molding. An integrated circuit package generally includes a protective housing, which surrounds the integrated circuit die. The protective housing is usually filled with a liquid potting material, or other encapsulant, which then hardens in situ. During the introduction of the liquid, however, the mold, molding material or other elements are susceptible to crashing, such as collapsing, deforming, or protruding to the integrated circuit die.

With a heatspreader attached to the top of the integrated circuit die, there will be a greater risk of crashing the die in the top mold cavity during the molding process. This is mainly because of height variations or warping during processing and fabrication that affect the design tolerances. Dimensional variation comes in several different ways and processes affecting the total height. A sample of some sources affecting the total height include the following: bondline thickness (BLT) variation during die attach, die tilt, die thickness variation during backgrind, heatspreader dimensional tolerance, warping and dimensional changes due to shrinkage and expansion in part due to thermal cycles such as in assembly processes.

Thus, a need still remains for an integrated circuit package system to provide improved reliability and manufacturing yield with heatspreaders. In view of the increasing demand for improved density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a substrate having an integrated circuit die, attaching a heatspreader having a force control protrusion on the substrate, and forming an encapsulant over the heatspreader and the integrated circuit die.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
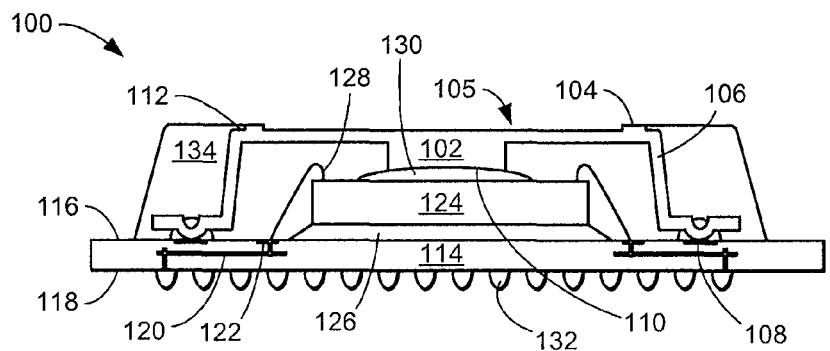
FIG. 1 is a cross-sectional view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. Similarly, although the sectional views in the drawings for ease of description show the invention with surfaces as oriented downward, this arrangement in the FIGs. is arbitrary and is not intended to suggest that invention should necessarily be in a downward direction. Generally, the device can be operated in any orientation. In addition, the same numbers are used in all the drawing FIGs. to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "on" refers to direct contact among the elements.

The term "processing" as used herein includes deposition of material or photoresist, patterning, exposure, development, forming, bending, etching, cleaning, and/or removal of the material or photoresist as required in forming a described structure.

Referring now to FIG. 1, therein is shown a cross-sectional view of an integrated circuit package system 100 in an embodiment of the present invention. The integrated circuit package system 100 includes a heatspreader 102 having a force control protrusion 104, support posts 106, a base link surface 108, a die link surface 110, and a mold seal surface 112. The force control protrusion 104 is formed having a recessed center area 105 within a predetermined distance of the support posts 106 for redistribution of assembly forces and the mold seal surface 112. The base link surface 108 is attached to a substrate 114 including a first surface 116 for internal connections and a second surface 118 for external connections. Thus, the base link surface 108 of the heatspreader 102 is directly attached to and directly on the first surface 116 of the substrate 114. The first surface 116 and the second surface 118 are connected by substrate traces 120 and substrate pads 122. The substrate pads 122 can optionally provide mounting and connecting of the support posts 106. The force control protrusion 104 can be directly over only the substrate 114.

The support posts 106 are formed with a predetermined distance from an integrated circuit 124 for redistribution of assembly forces and providing flexibility and elasticity. The integrated circuit 124 is attached to the first surface 116 of the substrate 114 with a mounting material 126, such as a die attach adhesive. Electrical connectors 128, such as bond wires, electrically connect the integrated circuit 124 to the substrate 114 through the substrate pads 122. The die link surface 110 of the heatspreader 102 attaches to the integrated circuit 124 with an attachment material 130, such as a thermally conductive adhesive, to provide improved thermal conductivity. External connectors 132 are formed on the second surface 118 of the substrate 114 to provide connectivity to a next level system such as a printed circuit board.

An encapsulant 134 covers and protects the heatspreader 102, the integrated circuit 124, the electrical connectors 128, and a portion of the first surface 116 of the substrate 114. Assembly processes, such as an encapsulation process or molding process, apply the encapsulant 134 under pressure over the heatspreader 102, the integrated circuit 124, the electrical connectors 128 and the first surface 116 of the substrate 114. The recessed center area 105 can be exposed from the encapsulant 134. Assembly forces from the pressure of the assembly processes can be redistributed by the force control protrusion 104 through the support posts 106 and away from the integrated circuit 124. It has been discovered that the integrated circuit package system 100 redistributes the assembly forces as well as significantly improves spring action of the heatspreader 102, eliminating dimensional stacking issues that cause die crashing.

Figure 2:
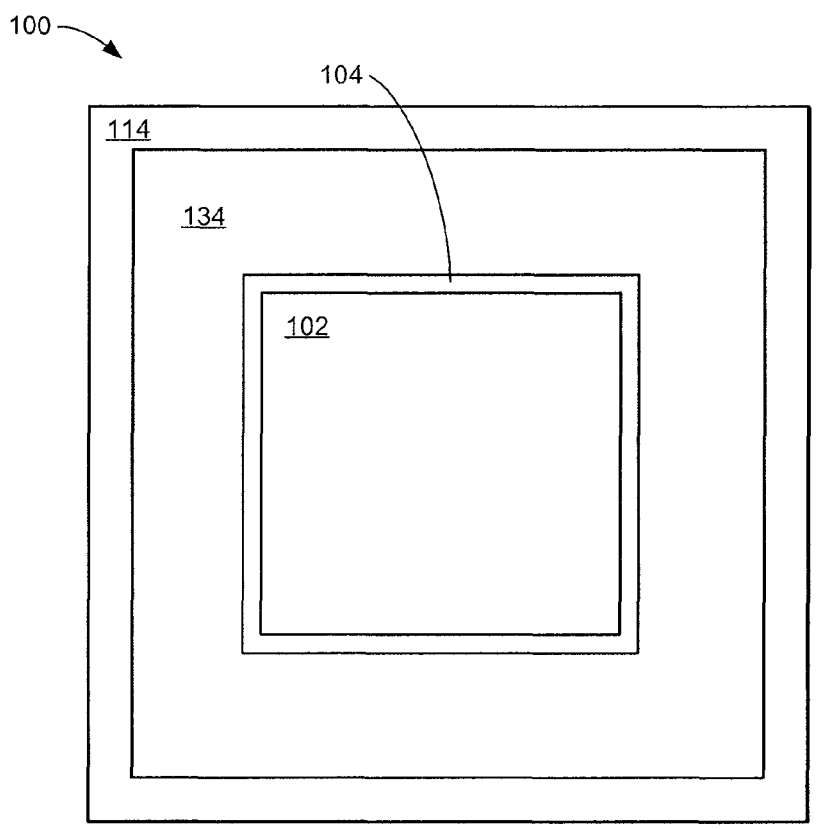
FIG. 2 is a top view of the integrated circuit package system.

Referring now to FIG. 2, therein is shown a top view of the integrated circuit package system 100. The integrated circuit package system 100 includes the heatspreader 102 having the force control protrusion 104. The encapsulant 134 is formed around a top of the heatspreader 102 and over the substrate 114. The encapsulant 134 covers a portion of the heatspreader 102 including the support posts 106 of FIG. 1, the integrated circuit 124 of FIG. 1 as well as a portion of the substrate 114. For illustrative purposes, the force control protrusion 104 is shown in the shape of a rectangle although it is understood that the force control protrusion 104 may be in any shape. Further, for illustrative purposes, the heatspreader 102 is shown in the shape of a rectangle although it is understood that the heatspreader 102 may be in any shape.

Figure 3:
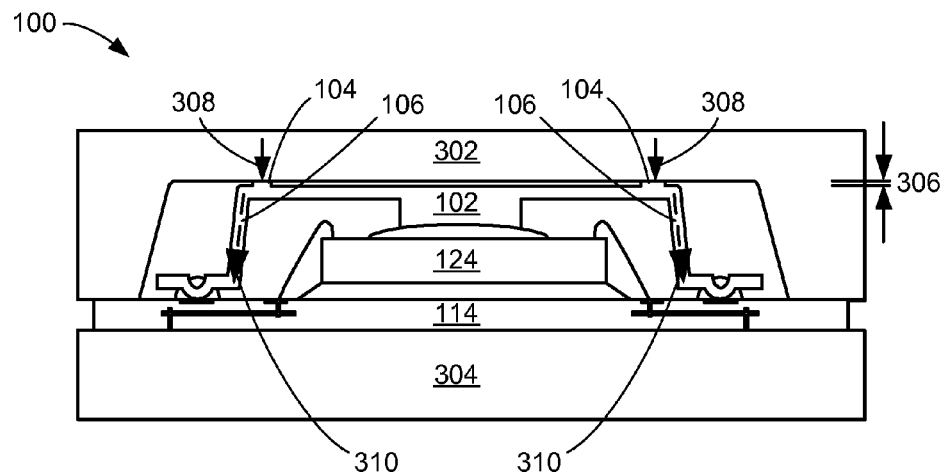
FIG. 3 is a cross-sectional view of the integrated circuit package system in a molding phase.

Referring now to FIG. 3, therein is shown a cross-sectional view of the integrated circuit package system 100 in a molding phase. The integrated circuit package system 100 includes the heatspreader 102 including the force control protrusion 104 and the support posts 106. The heatspreader 102 attaches to the substrate 114 over the integrated circuit 124. A top cavity 302, such as a top mold, is provided over the integrated circuit package system 100 and a bottom cavity 304, such as a bottom mold. The top cavity 302 contacts the force control protrusion 104 forming a step 306 in a gap between the top cavity 302 and a top surface of the heatspreader. A first force at arrows 308 is applied to the force control protrusion 104 by the top cavity 302.

Variations in materials and tolerances creating the dimensional stacking issues that provide a dimensional difference between the top cavity 302 and the heatspreader 102 and result in the first force at arrows 308. The force control protrusion 104 is formed at a distance to the support posts 106 predetermined to redistribute the first force at arrows 308 to the support posts 106 with a second force at arrows 310. The second force at arrows 310 is applied to the substrate 114 at a predetermined distance from the integrated circuit 124. It has been discovered that the integrated circuit package system 100 redistributes the first force at arrows 308 away from the integrated circuit 124 because the first force cannot be applied at the recessed center area 105 of FIG. 1 because of the gap caused by the step 306.

Figure 4:
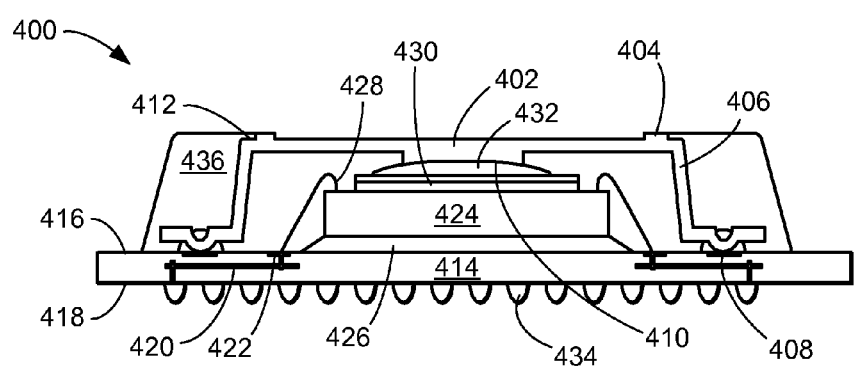
FIG. 4 is a cross-sectional view of an integrated circuit package system in an alternative embodiment of the present invention.

Referring now to FIG. 4, therein is shown a cross-sectional view of an integrated circuit package system 400 in an alternative embodiment of the present invention. In a manner similar to the integrated circuit package system 100, the integrated circuit package system 400 includes a heatspreader 402 having a force control protrusion 404, support posts 406, a base link surface 408, a die link surface 410, and a mold seal surface 412. The force control protrusion 404 is formed within a predetermined distance of the support posts 406 for redistribution of assembly forces and the mold seal surface 412. The base link surface 408 is attached to a substrate 414 including a first surface 416 for internal connections and a second surface 418 for external connections. The first surface 416 and the second surface 418 are connected by substrate traces 420 and substrate pads 422. The substrate pads 422 can optionally provide mounting and connecting of the support posts 406.

The support posts 406 are formed with a predetermined distance from an integrated circuit 424 for redistribution of assembly forces and providing flexibility and elasticity. The integrated circuit 424 is attached to the first surface 416 of the substrate 414 with a mounting material 426, such as a die attach adhesive. Electrical connectors 428, such as bond wires, electrically connect the integrated circuit 424 to the substrate 414 through the substrate pads 422. An optional tape 430 can be applied to the integrated circuit 424 for protection from scratches and providing additional strength. The optional tape 430 provides protection to a side of the integrated circuit 424 having active circuitry (not shown).

The optional tape 430 also provides additional strength to the integrated circuit 424 to maintain structural integrity including resistance to deformation such as bending or cracking. The integrated circuit 424 is partially covered by the optional tape 430 over a side opposite the mounting material 426 on the first surface 416 of the substrate 414. The die link surface 410 of the heatspreader 402 attaches to the optional tape 430 with an attachment material 432, such as a thermally conductive adhesive, to provide improved thermal conductivity. External connectors 434 are formed on the second surface 418 of the substrate 414 to provide connectivity to a next level system such as a printed circuit board.

An encapsulant 436 covers and protects the heatspreader 402, the integrated circuit 424, the electrical connectors 428, and a portion of the first surface 416 of the substrate 414. Assembly processes, such as an encapsulation process or molding process, apply the encapsulant 436 under pressure over the heatspreader 402, the integrated circuit 424, the electrical connectors 428 and the first surface 416 of the substrate 414. Assembly forces from the pressure of the assembly processes can be redistributed by the force control protrusion 404 through the support posts 406 and away from the integrated circuit 424. It has been discovered that the integrated circuit package system 400 redistributes the assembly forces as well as significantly improves spring action of the heatspreader 402, eliminating dimensional stacking issues that cause die crashing.

Figure 5:
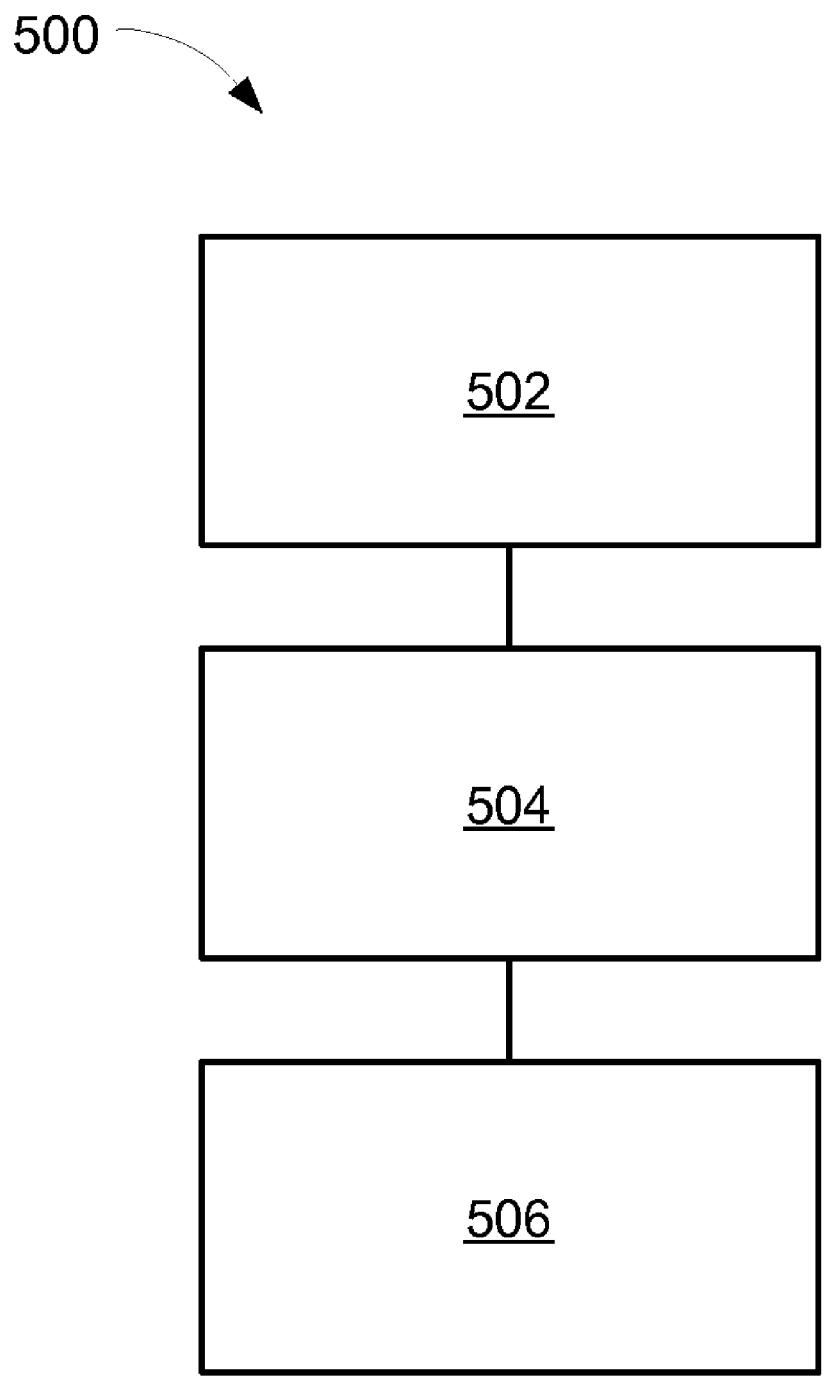
FIG. 5 is a flow chart of an integrated circuit package system for manufacturing the integrated circuit package system in an embodiment of the present invention.

Referring now to FIG. 5 is a flow chart of an integrated circuit package system 500 for manufacturing the integrated circuit package system 100 in an embodiment of the present invention. The system 500 includes providing a substrate having an integrated circuit in a block 502; attaching a heatspreader having a force control protrusion on the substrate for redistribution of assembly forces in a block 504; and forming an encapsulant over the heatspreader and the integrated circuit in a block 506.

In greater detail, a method to fabricate the integrated circuit package system 100, in an embodiment of the present invention, is performed as follows:
1. Forming a substrate having a first surface and an integrated circuit. (FIG. 1)
2. Attaching a heatspreader having a force control protrusion over the first surface of the substrate for redistribution of assembly forces. (FIG. 1)
3. Molding an encapsulant over the heatspreader and the integrated circuit providing the force control protrusion substantially exposed. (FIG. 1)

It has been discovered that the present invention thus has numerous aspects.

An aspect is that the present invention provides the heatspreader having the force control protrusion. The heatspreader has a step formed by a small gap on the top surface of the heatspreader provided by the force control protrusion. The gap serves as a relief region during the molding process of the integrated circuit package system. The force control protrusion is formed on the top surface of the heatspreader and on the side of the heatspreader opposite the integrated circuit.

It has been discovered that the disclosed structure provides a significant majority of the molding force on the support post. The support posts of the heatspreader hold the heatspreader in place above the integrated circuit and are substantially in line with the upper region of the force control protrusion. The majority of the forces during the assembly processes are applied on the force control protrusion and redistributed or redirected through the support posts of the heatspreader attached to the substrate.

It has also been discovered that the disclosed structure provides indirect force towards the die. The assembly forces on the heatspreader during the molding process are redirected through the support posts of the heatspreader. The support posts are positioned at a predetermined distance from the integrated circuit to maintain the physical and electrical integrity of the integrated circuit. The significant majority of the assembly forces go through the support posts, so only indirect forces are applied to the region over the integrated circuit.

Yet another discovery of the disclosed structure is that it prevents the top mold from crashing to the integrated circuit. The force control protrusion on the top of the heatspreader creates a gap between the heatspreader and the top mold during mold clamping. Having the majority of the assembly forces directed along the support posts and only indirect vectors of the assembly forces over the integrated circuit, prevents the top mold, encapsulant or heatspreader from crashing, collapsing, deforming or protruding to the integrated circuit.

Yet another discovery of the disclosed structure is that the spring-like action of the heatspreader improves dimensional stacking issues. The heatspreader including the support posts are formed having structural flexibility and elasticity. The structural flexibility and elasticity in the vertical axis provides a spring-like functioning of the heatspreader. Stacking additional elements, including devices or other packages, in the shorter vertical dimension is improved by the resilience and accommodation of the spring-like action.

Yet another discovery of the disclosed structure is that the optional tape provides extra strength. The optional tape is applied to protect the integrated circuit from damage, such as scratching. The optional tape further provides additional strength for maintaining structural integrity of the integrated circuit to prevent bending or cracking. The optional tape can also provide accommodation for additional structural flexibility for the heatspreader and additional strength to the adhesive contact between the heatspreader and the integrated circuit.

These and other valuable aspects of the present invention consequently further the state of the technology to at least the next level.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:
1. A method for manufacturing an integrated circuit package system comprising:

providing a substrate;
attaching an integrated circuit to the substrate;
applying a tape on the integrated circuit;
attaching an attachment material to the tape;
attaching a heatspreader to the attachment material and directly to the substrate, the heatspreader having a force control protrusion with a recessed center area for redistribution of assembly forces, the force control protrusion directly over only the substrate; and
forming an encapsulant over the heatspreader and the integrated circuit with the recessed center area exposed from the encapsulant.

2. The method as claimed in claim 1 wherein attaching the heatspreader includes forming the heatspreader having a support post at a predetermined distance from the integrated circuit.

3. The method as claimed in claim 1 wherein attaching the heatspreader includes forming a mold seal surface with a predetermined size adjacent to the force control protrusion.

4. The method as claimed in claim 1 wherein attaching the heatspreader includes forming the force control protrusion substantially adjacent to a support post.

5. The method as claimed in claim 1 wherein attaching the heatspreader includes attaching a base link surface of the heatspreader to the substrate.

6. A method for manufacturing an integrated circuit package system comprising:
forming a substrate having a first surface;
attaching an integrated circuit to the substrate;
applying a tape on the integrated circuit;
attaching an attachment material to the tape;
attaching a heatspreader to the attachment material and directly on the first surface, the heatspreader having a force control protrusion with a recessed center area for redistribution of assembly forces, the force control protrusion directly over only the substrate; and
molding an encapsulant over the heatspreader and the integrated circuit with the recessed center area and the force control protrusion substantially exposed from the encapsulant.

7. The method as claimed in claim 6 wherein attaching the heatspreader includes a mold seal surface partially over a support post and adjacent to the force control protrusion.

8. The method as claimed in claim 6 wherein attaching the heatspreader includes forming the force control protrusion at a predetermined distance from the integrated circuit.

9. The method as claimed in claim 6 wherein attaching the heatspreader includes applying the attachment material between the heatspreader and the integrated circuit.

10. The method as claimed in claim 6 wherein attaching the heatspreader includes applying the attachment material between the heatspreader and the tape on the integrated circuit.

11. An integrated circuit package system comprising:
a substrate;
an integrated circuit attached to the substrate;
a tape on the integrated circuit;
an attachment material attached to the tape;
a heatspreader attached to the attachment material and directly to the substrate, the heatspreader having a force control protrusion with a recessed center area for redistribution of assembly forces, the force control protrusion directly over only the substrate; and
an encapsulant over the heatspreader and the integrated circuit with the recessed center area exposed from the encapsulant.

12. The system as claimed in claim 11 wherein the heatspreader includes the heatspreader having a support post at a predetermined distance from the integrated circuit.

13. The system as claimed in claim 11 wherein the heatspreader includes a mold seal surface with a predetermined size adjacent to the force control protrusion.

14. The system as claimed in claim 11 wherein the heatspreader includes the force control protrusion substantially adjacent to a support post.

15. The system as claimed in claim 11 wherein the heatspreader includes a base link surface attached to the substrate.

16. The system as claimed in claim 11 wherein:
the substrate having a first surface and the integrated circuit thereon;
the heatspreader having the force control protrusion over the first surface of the substrate for redistribution of the assembly forces; and
the encapsulant over the heatspreader and the integrated circuit with the force control protrusion substantially exposed.

17. The system as claimed in claim 16 wherein the heatspreader includes a mold seal surface partially over a support post and adjacent to the force control protrusion.

18. The system as claimed in claim 16 wherein the heatspreader includes the force control protrusion at a predetermined distance from the integrated circuit.

19. The system as claimed in claim 16 further comprising the attachment material between the heatspreader and the integrated circuit.

20. The system as claimed in claim 16 further comprising the attachment material between the heatspreader and the tape on the integrated circuit.

* * * * *